United States Patent [19]

Stark et al.

[11] Patent Number: 5,020,011

[45] Date of Patent: May 28, 1991

[54] SYSTEM FOR DISPLAYING ADAPTIVE INFERENCE TESTING DEVICE INFORMATION

[75] Inventors: William D. Stark, Ithaca; Gregory C. Prestas, Candor, both of N.Y.

[73] Assignee: Array Analysis, Inc., Ithaca, N.Y.

[21] Appl. No.: 433,591

[22] Filed: Nov. 7, 1989

[51] Int. Cl.⁵ .................. G05B 19/02; G06F 11/00; G09G 1/06; G01R 23/16

[52] U.S. Cl. ..................... 364/580; 371/26; 371/29.1; 340/721; 340/747; 324/77 R; 361/481

[58] Field of Search ............ 364/580, 480, 481, 483, 364/188, 138, 521, 710.1, 710.11; 340/706, 709, 721, 723, 747; 324/77 R, 77 A, 114, 121 R, 158 R; 371/21.4, 21.6, 22.1, 22.4, 24, 26, 29.1; 315/377

[56] References Cited

U.S. PATENT DOCUMENTS

| | | | |
|---|---|---|---|
| 4,381,563 | 4/1983 | Groom, Jr. et al. | 371/22.1 X |
| 4,641,348 | 2/1987 | Neuder et al. | 364/580 X |
| 4,646,250 | 2/1987 | Childress | 364/518 |
| 4,694,286 | 9/1987 | Bergstedt | 340/709 X |
| 4,731,609 | 3/1988 | Reynolds et al. | 364/521 X |
| 4,760,331 | 7/1988 | Komuro et al. | 324/121 R |
| 4,761,640 | 8/1988 | Slavin | 324/121 R X |
| 4,847,795 | 7/1989 | Baker et al. | 364/579 |
| 4,851,833 | 7/1989 | Govekar | 340/722 |
| 4,868,496 | 9/1989 | Havel | 324/121 R X |
| 4,868,552 | 9/1989 | Chang | 324/121 R X |
| 4,873,623 | 10/1989 | Lane et al. | 340/706 X |
| 4,907,230 | 3/1990 | Heller et al. | 371/68.3 X |

OTHER PUBLICATIONS

HP, *Test & Measurement Catalog* 1989, pp. 257-263.
Naiman, *Macintosh Bible*, 2nd Edition, pp. 33, 34 and 683, 1988-1989.

*Primary Examiner*—Joseph L. Dixon
*Attorney, Agent, or Firm*—Salzman & Levy

[57] ABSTRACT

An adaptive inference system for testing electrical or electronic devices or assemblies. A method is provided for coordinating testing operations in a graphical test sequence presented upon a time dependent display. The method includes the steps of displaying the test data and information along the time dependent axis of a display screen using colored highlighting to identify regions of interest, using next fault searches to automatically locate highlighted areas and using windows positioned alongside data and channel labels along the time dependent axis for initiating an operation or test routine in the graphical test sequence.

22 Claims, 6 Drawing Sheets

SYSTEM FOR DISPLAYING ADAPTIVE INFERENCE TESTING DEVICE INFORMATION

RELATED APPLICATIONS

The present invention is particularly directed to use in an adaptive inference testing system which will employ varying features and functions, described in differing aspects in any one or more of the following copending patent applications, including this one, all filed concurrently and assigned to the present assignee: U.S. Ser. No. 07/433,612 for "INTERACTIVE ADAPTIVE INFERENCE SYSTEM"; U.S. Ser. No. 07/433,608 for "ARRAY STRUCTURE FOR USE IN AN ADAPTIVE INFERENCE TESTING DEVICE"; U.S. Ser. No. 07/433,335 for "METHOD FOR CALCULATING ADAPTIVE INFERENCE TEST FIGURE OF MERIT"; U.S. Ser. No. 07/433,594 for "UNPREDICTABLE FAULT DETECTION USING ADAPTIVE INFERENCE TESTING TECHNIQUES".

BACKGROUND OF THE INVENTION

The present invention relates to a system for displaying information and, more particularly, to a system for displaying information relating to an adaptive inference testing device.

In the field of electronics in general and in printed circuit board assembly in particular, electronic components are generally mounted, affixed, plugged into or otherwise associated with printed circuit boards. Such electronic components may be analog devices, digital devices, integrated circuits and the like.

The boards, in turn, usually have electrical contacts along one or more sides thereof for plugging into connectors. On a typical personal computer, for example, some five to ten boards are provided and are associated, by means of connectors, with a so-called mother board. Of course, more sophisticated machines would tend to have a greater number of boards and less sophisticated instruments would have tend to have fewer boards.

As the technology of electronic devices advances and as the consumer market for advanced products matures, not only does the functional complexity and the number of manufactured machines increase, but so too may the number of components per board increase. This makes it difficult to directly access all of the test points required to test a loaded board completely.

Finally, components mounted on the boards become ever more powerful and more difficult to test as new functions are required.

It therefore has become increasingly important to enhance procedures for testing proper operation of components, boards and machines. To the extent that such testing procedures can be improved, more efficient methods and more accurate methods are ensured.

For purposes of this description, the term "adaptive inference" means the ability to predict the cause of a previously unobserved fault from the relationships with other known fault information.

Also for purposes of this description, the term "unit under test (UUT)" is used to identify any component or assembly to be tested. Heretofore, UUTs were tested by technicians with the aid of certain instruments as simple as a voltmeter or as complex as a mainframe computer. Such testing methods were necessarily time consuming and labor intensive.

More recently, programmable systems have been used to test specific UUTs. These systems tend to be more efficient than manual methods, by allowing a greater number of UUTs to be tested in a given amount of time. But in order to use these programmable systems to test every possible condition of a component or board, every possible stimulant must be applied to the UUT and every possible response must be analyzed or at least compared with its associated proper reference response.

Even on a simple UUT, unanticipated problems can arise in many ways. Previous methods required a test engineer to program each of these possible faults into a machine. This required enormous amounts of programming. Over 25,000 lines of code and six months of effort were not unusual.

The present invention eliminates this programming effort for fault isolation by mathematically comparing a new fault to previously stored faults. A figure of merit is derived and displayed to indicate likely causes and closeness to known faults.

For instance, a certain circuit node may be shorted to ground and the faults recorded and stored in memory. When the same node is shorted to +5 v, the acquired data is not going to be identical, but may be very close. In a traditional programming environment, two separate programs would be needed to cover both those cases. But the present invention indicates a high probability (figure of merit) that the indicated node is the source of the fault.

Powerful display tools in accordance with the present invention, such as waveform displays with color highlighting to show discrepancies, aid in localizing the troublesome area. A figure of merit less than 100% for faults never before experienced can signal the operator to investigate.

In the above example, when the operator discovers that a node is stuck high (not grounded), with a single keystroke the new fault can be added to memory. If the fault occurs again, the message displayed indicates this new fault with a high figure of merit: that same node is likely to be stuck to +5 v. The next time the test is run with the same node stuck high, the system displays the message and indicates the second most likely diagnosis is the same node stuck low with a figure of merit less than 100%.

In this way, the system accumulates a representation of knowledge that it has gained in the past. It can infer things it has never seen. It operates similarly to the way that a human operator would debug a circuit. Moreover, the system improves with time and, of course, it never forgets.

A particularly vexing problem relates to the fact that proper fault detection, identification and isolation requires sophisticated displaying mechanisms, which are often lacking from prior art testing systems. As the complexity of components and assemblies increases, so too should the sophistication of displays needed to identify the nature of faults and, of course, locations thereof.

Heretofore, displays often showed no more than LED indicators or similar rudimentary lamps or meter scales to indicate whether a test node operates properly upon application of an appropriate stimulus thereto. What is generally lacking in prior art testing devices is a time-dependent display with analog and digital signals and markers for locating features of interest.

U.S. Pat. No. 4,847,795 issued to Baker et al. discloses a system for diagnosing electronic assembly defects.

The system has a knowledge base for storing information on UUT and receiving current test failure. The system has a pattern search which compares current test data to stored information. A voting section recommends a repair process. The knowledge base is updated with information as to whether or not the repair eliminated the defect.

It would be advantageous to provide a display for an adaptive inference testing device.

It would also be advantageous to provide a display for an adaptive inference testing device being time-dependent.

It would also be advantageous to provide such a display with both analog and digital signals.

It would also be advantageous to provide such a display with highlighted portions.

It would also be advantageous to provide such a display with colored highlighted portions.

It would also be advantageous to provide such a display with the ability to highlight data errors, tolerance and reference with colored highlighted portions.

It would also be advantageous to provide such a display with repositioning capacity so that the user can view one highlighted area of interest after another without having to search for such areas manually.

It would also be advantageous to provide such a display with pop-up windows and pull-down menus adjacent to test results and channel labels so that options and data within the windows align with the channel labels and display data.

SUMMARY OF THE INVENTION

In accordance with the present invention, there is provided an adaptive inference system for electrical or electronic devices or assemblies. Methods are provided for organizing test data into graphically oriented arrays, manipulating said data arrays and coordinating testing operations in a graphical test sequence presented upon a time dependent display. The method includes the steps of displaying the test data and information along the time dependent axis of a display screen using colored highlighting to identify regions of interest, using next fault searches to automatically locate highlighted areas and using windows positioned alongside data and channel labels along the time dependent axis for initiating an operation or test routine in the graphical test sequence.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

Figure 1:
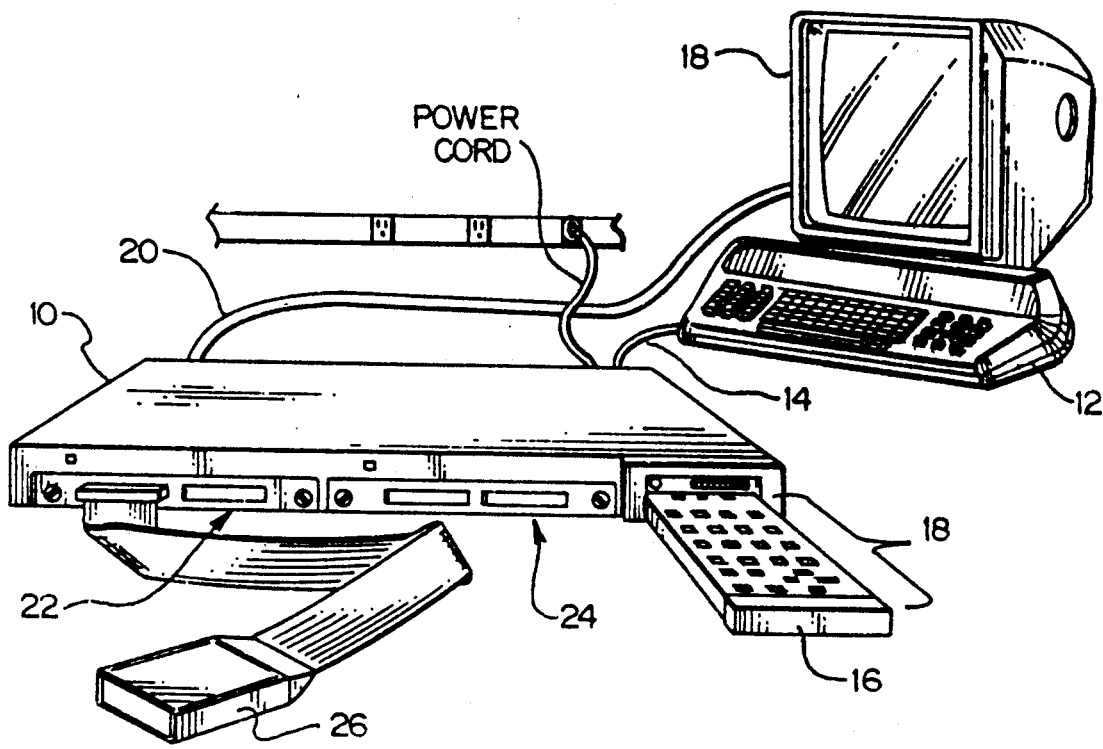
FIG. 1 is a perspective view of the MFI and MCP of the present invention.

Referring now to FIG. 1, there is illustrated the preferred physical embodiment of the present invention. The invention includes a microprocessor-based Multifunction Instrument (MFI) 10.

The MFI 10 supplies system control and power and can perform complex tasks without requiring a host PC 12, such as is manufactured by IBM CORP. However, when the MFI 10 is connected to inferential software, described hereinbelow, which is hosted on the PC 12, other testing functions can be performed, as described herein. The MFI chassis provides an optional printer connector, not shown, communications connector 14, and a GPIB connector, not shown.

A keypad 16 is built into the MFI chassis providing an input interface for stand alone operation. The keypad 16 contains function keys 18 used to respond to MFI menus and data displays, described later herein.

A video monitor 18 is connected to the MFI 10 via a monitor cable 20. The video monitor 18 is used during stand alone operation to view data displays and menus, described later herein.

The MFI chassis has two hardware modules called plug-ins 22-24 that configure the MFI 10. There are plug-ins 22-24 for data acquisition, pattern generation, EPROM programming, EPROM emulation and other functions. The MFI 10 must have at least one plug-in (two plug-ins are shown in the FIGURE) 22-24 installed in order to operate as a testing tool.

Connected to the plug-ins 22 and 24, in turn, are probes 26, at least one or two for each plug-in 22 and 24, only one of which is shown in FIG. 1. Different types of probes 26 can be used with a particular type of plug-in 22 and 24 to achieve different functions.

Figure 2:
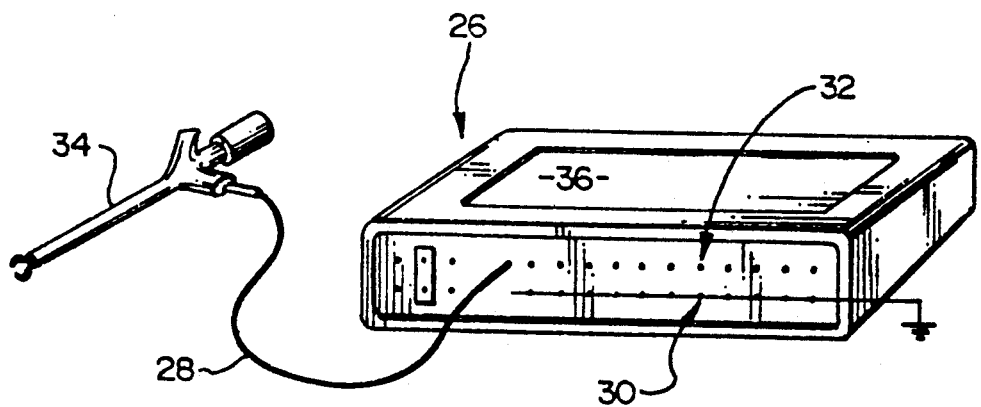
FIG. 2 is a perspective view of the probe assembly.

Referring now also to FIG. 2, there is shown a perspective view of the probe assembly. Probes 26 extend from the plug-ins 22 and 24 (FIG. 1) to test leads 28 attachable to a unit under test (UUT), not shown. In this way, probes are the conduit between the UUT and the MFI 10. Probes 26 contain a set of ground pins 30 and signal pins 32 that are connected by means of test clips 34 to the UUT. Each plug-in 22 and 24 and probe 26 must be correctly matched to perform desired functions (e.g., data acquisition, pattern generation, and continuity testing). A label 36 identifies the function of the probe 26.

Figure 3:
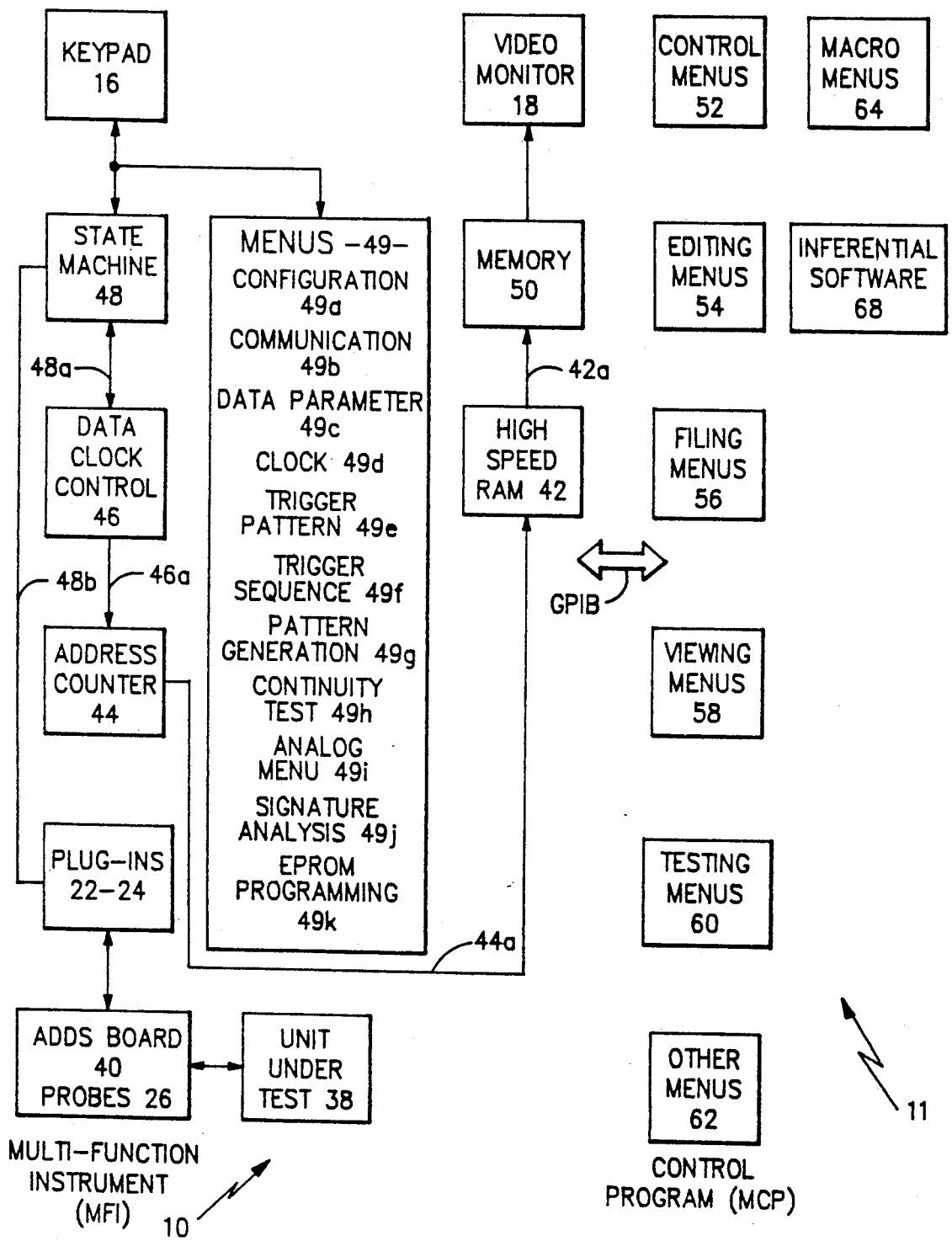
FIG. 3 is a block diagram of the MFI and MCP of the present invention.

Referring now to FIG. 3, there is shown a block diagram of the preferred embodiment of the present invention. The inventive circuit testing tool has the microprocessor-based Multifunction Instrument (MFI) 10 connected to an MFI Control Program (MCP) 11 by means of a GPIB interface (shown by arrow), which MCP 11 is hosted on the personal computer 12 (FIG. 1). A printout of the MCP program listing is provided as Appendix A a copy of which may be found in the patented file and with the aforementioned patent application titled "Interactive Adaptive Inference System" U.S. Ser. No. 07/433,612.

Connected to MFI 10 is a unit under test (UUT) 38. UUT 38 may be a large, complex printed circuit board, not shown, or a smaller component that may be disposed on or near such a board. It should also be understood that such a component can be displaced from a larger assembly or disconnected entirely therefrom. Any electrical or electronic device or assembly can be used with the system.

The MFI 10 contains a high speed random access memory 42, an address counter 44, a data clock control 46, a state machine 48 and buffer memory 50. State machine 48 is connected to data clock control 46 by means of lines 48a. Data clock control 46 is connected to address counter 44 by means of lines 46a. State machine 48 is connected to plug-ins 22 and 24 by means of lines 48b.

Address counter 44 is connected to RAM 42 by means of lines 44a. RAM 42 is connected to memory 50 by means of line 42a.

Connected to plug-ins 22–24 are probes 26 and Analog/Digital/Drive/Sensor (ADDS) boards 40.

The MFI 10 operates as a logic analyzer, digital pattern generator, continuity tester, signature analyzer, microprocessor, disassembler, digital storage oscilloscope, analog waveform generator, EPROM programmer or EPROM emulator. These functions can be controlled by the MFI 10 in the stand alone mode or by the MCP 11 in the coupled mode. When the MFI 10 is coupled with the MCP 11, the combination of devices can run automatic tests and can learn from the results of completed tests.

MFI 10 runs an internal firmware program generating menus and data displays; responding to keypad inputs (stand alone mode); controlling the operation of the address counter 44, data clock 46, ADDS boards 40, and trigger control 48; and responding to the control status and data communication from the host PC 12 running MCP software.

A plurality of MFI's may be stacked. When in this mode, one MFI 10 acts as the master processor controlling interfaces, not shown, between the other processors.

The multiple MFI's can simultaneously acquire (read) and generate (write) digital and analog data, not shown. Data is acquired or sent via the ADDS boards 40. The MFI 10 typically contains several digital and analog ADDS boards 40. The functionality of ADDS boards 40 (analog/digital, drive/sense) is controlled via MFI menus, described in greater detail hereinbelow. Attached to the ADDS boards 40 are the plug-ins 22 and 24, used to configure the MFI 10 for the data acquisition or pattern generation.

Data output to or input from the UUT 38 via the ADDS boards 40, plug-in 22 and 24, and probes 26 is resident in the RAM 42. The RAM 42 is structured into 96 channels with each channel being 2 K samples deep. All data is stored in the RAM 42. Such data is stored in the RAM 42 as digital data, but represents the analog form. That is, analog data input is converted to digital form prior to storage in RAM 42 and converted from digital to analog form when output from RAM 42. RAM control is performed by the address counter 44, data clock control 46 and trigger control 48.

The MFI 10 operates in three states:
 a) an IDLE state where the data clock 46 is OFF, the address counter 44 is OFF, and no data is being written to or read from the RAM 42;
 b) an ARMED state where the data clock 46 is ON or halted, the address counter 44 is ON and data is being written to or read from the RAM 42; and
 c) a TRIGGERED state where the data clock 46 is Stopped, the address counter 44 is stopped, and the contents of the RAM 42 are Frozen.

When the MFI 10 is ARMED, it is active either generating data for or acquiring data from the UUT 38.

The trigger control 48 determines the length of time the data clock 46 will be operable (i.e., how long the MFI 10 will be ARMED). Trigger control 48 monitors the acquired data searching for sequence of trigger patterns.

A trigger pattern is a combinational state of the acquisition channels of the MFI 10. States can be high, low or "don't care". Several trigger patterns can be used simultaneously. Once the specified sequence of trigger patterns has been recognized, the MFI 10 enters a TRIGGERED state. The state machine 48 counts the number of samples past the trigger event.

Several triggers can be used to start and stop data collection. Once the RAM 42 is full or the last trigger is reached, the data clock 46 and address counter 44 are stopped and the RAM 42 frozen. The MFI 10 reads the contents of the RAM 42 into local memory 50.

Once data is in local memory 50, the MFI 10 can create a data display that is output to the video monitor 18 or transferred to the PC 12 for analysis. The address counter 44 points to a sample address in the RAM 42 where data is either written into or read out of the ADDS boards 40. The data clock 46, which may be sourced externally, determines the speed that the address counter 44 counts through the RAM channels and determines the time between samples. Data clock 46 can be made to operate at a speed greater than the speed at which the UUT 38 would normally operate.

In the stand alone mode, the MFI 10 operation described above is controlled by menus 49 accessed via the keypad 16 and viewed on the video monitor 18.

Each menu 49a–49k has a series of questions that, when answered, provides the capability to modify or adjust MFI operation. The MFI 10 reconfigures these menus 49 to show only those questions and answers that relate to the types of plug-ins 22–24 and probes 26 that have been installed.

The first menu that appears when the MFI 10 is activated is the configuration menu 49a. This menu 49a provides information about the present configuration of the MFI 10, such as what plug-ins 22 and 24 are attached, whether the MFI 10 is stacked or uncoupled, which machine or operating state the MFI 10 is in, and what SETUP mode is selected.

A SETUP mode is the set of all MFI 10 operating parameters a user can modify on all the menus plus one display parameter. There are two complete setups allowing a user to change setups without having to remodify all the menus. In addition to status information, this configuration menu 49a provides the capability to change configurations.

A communication menu 49b sets up the printer ports and the communication ports on the MFI 10. This menu can be accessed only from the configuration menu 49a.

The data parameter menu 49c provides the capability to select the display mode, trigger delay, probe and channel options, and auto arm. The trigger delay provides the capability to adjust the number of samples to be acquired after the sequence has been satisfied.

The clock menu 49d provides the capability to determine what points in time are to be sample points. Sample points are those points at which acquisition channels sample data and when generation channels output data.

The trigger pattern definition menu 49e provides the capability to set up to 14 trigger patterns. The trigger pattern is a set of logic levels, one logic level defining each acquisition channel. Logic levels can be defined as HI, LO, and DON'T CARE for each acquisition channel. When these logic levels simultaneously occur on all the acquisition channels, the trigger pattern has occurred.

The trigger sequence menu 49f provides the capability to instruct the MFI 10 to perform different actions as different trigger patterns occur.

The pattern generation menu 49g provides the capability to control the pattern generation plug-ins 22 and 24 and probes 26. There are two sources of patterns: algorithmic pattern, useful for generating analog signals; and "from the screen" pattern source which uses data records in the MFI buffer memory 50 as pattern sources.

The continuity test menu 49h controls the continuity tester plug-in 22 and 24 and probe 26.

The analog menu 49i provides the capability to specify that the data records of selected probes 26 be displayed on the timing display shown on either video monitor 18 or PC 12 (FIG. 1) as analog waveforms.

The signature analysis menu 49j provides control over the signature plug-in 22 and 24.

The EPROM programming menu 49k provides the capability to control the EPROM plug-in 22 and 24 and probe 26.

Data displays that appear on video monitor 18 or PC 12 provide the capability to observe and modify data acquired or generated by the MFI 10. There are four data displays provided with the MFI 10:
 a) timing display, not shown, displaying waveform data. The timing display acts as an adjustable window on the data record, not shown. The data record is larger than the window, but the window may be moved back and forth or up and down to show the whole data record. The data may also be magnified under the window for more precise observations.
 b) binary/hex display. These standard displays, well known in the art and not shown in detail herein, provide the capability to examine the data records sample by sample and channel by channel;
 c) octal display. This standard display, well known in the art and not shown in detail, displays the data record as a sequence of octal data; and
 d) processor disassembly displays, providing the capability to observe the processor code execution in the assembly language of the UUT processor.

Figure 4:
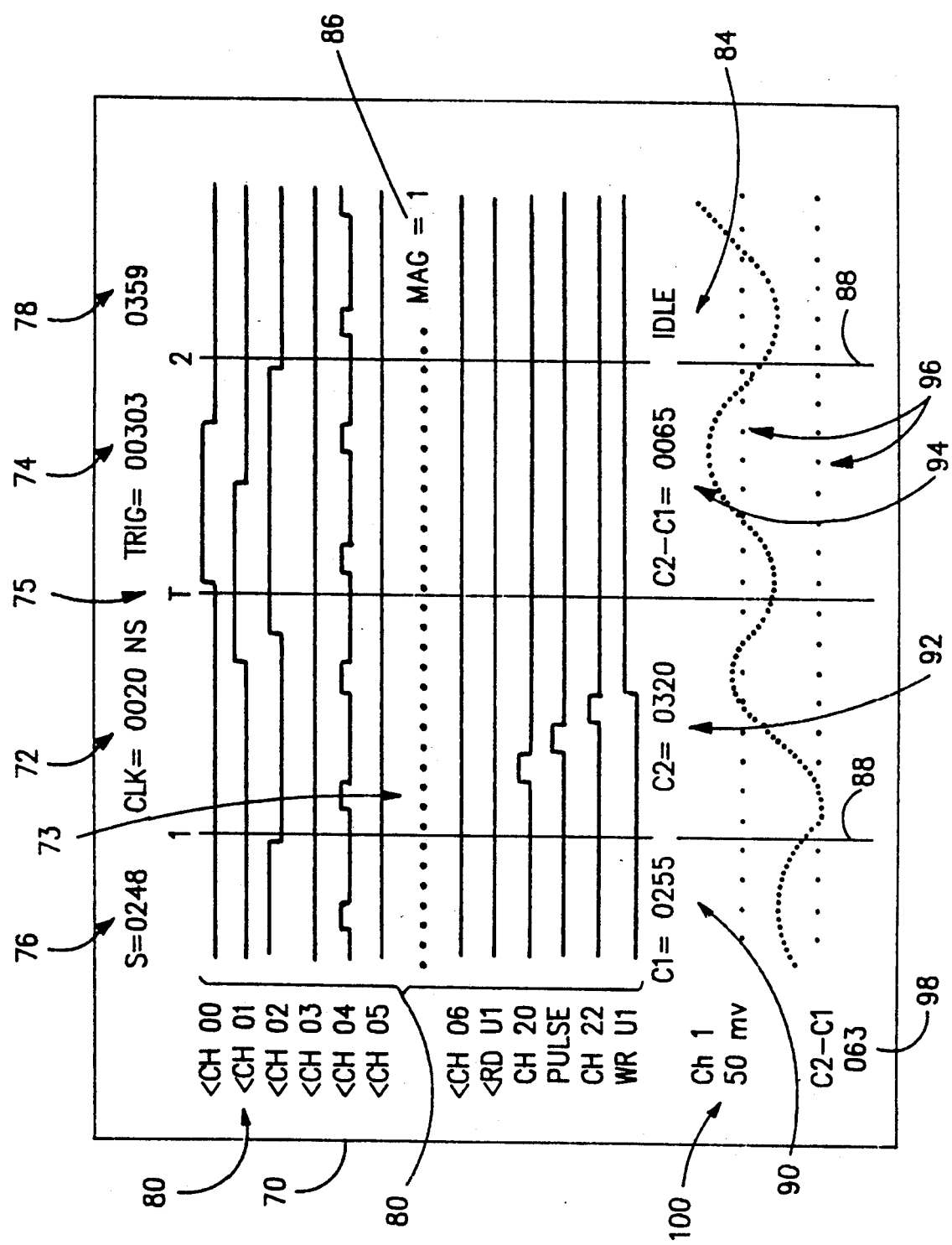
FIG. 4 is a schematic representation of a display on a video monitor.

Referring now also to FIG. 4, there is shown a typical timing diagram displayed on video monitor 18 or the PC 12 (FIG. 1).

The timing diagram display illustrates some of the key concepts described above. This example shows twelve digital channels and one analog channel. In the simplified example observe the following items:

DATA CLOCK 72

The user selected sampling rate for the data shown in this display is 20 ns per sample. The dotted horizontal line 73 in the middle of the display shows the actual positions of the sample clock.

TRIGGER POSITION 74

The trigger event 75 is indicated by the vertical dashed line. At this point in time, the states of the acquisition channels matched the user described trigger pattern. "Trig=00303" indicates the position of the trigger event as sample number 303 in the record.

SCREEN POSITION 76–78

"S=0248" indicates that the left edge of the screen 76 is displaying the 248th sample of the record. At the top right corner 78 "0359" indicates that the right edge of the screen is displaying the 359th sample of the record. Typically, the earliest sample in the record is sample 0 and the last is sample 1023. The last sample number is a function of record size.

CHANNELS 80

The indications on the left edge of the display are the channel labels. These labels identify the plug-in probe pin 32 (FIG. 2) that was connected to the point in the user's circuit that generated the waveform 82 to the right of the label.

WAVEFORMS 82

The waveforms displayed to the right of each channel label are representations of digital data captured by the MFI. This is the result of ACQUISITION.

MFI STATUS 84

This indicates MFI status as either ARMED, TRIGGERED, or as evidenced in this example, IDLE.

MAGNIFICATION

This indicates the resolution of the display. In this example, MAG=1 shows separate sample points at the highest resolution, 112 samples across the display.

TIMING CURSOR INDICATORS 88

These vertical solid lines are used to locate the signal events within the data record or to measure the time period of a signal event.

TIMING CURSOR 1 POSITION 90 AND TIMING CURSOR 2 POSITION 92

Indicate the sample number positions of the timing cursors.

DIFFERENCE BETWEEN TIMING CURSORS 94

Indicate the number of samples or time units between the timing cursors 90–92.

VOLTAGE CURSOR INDICATORS 96

Measure the amplitude of the analog waveforms.

DIFFERENCE BETWEEN VOLTAGE CURSORS 98

Indicates the number of vertical divisions between the voltage cursors 96.

ANALOG VOLTS PER DIVISION 100

This indicates the vertical scale of the analog channel. Divisions are actually the pixel size on the display.

When this example has completed its activities, the MFI 10 has obtained a set of data and stored it in the RAM 42. MFI stand alone operation (FIG. 3) is summarized in the following example of the MFI 10 functioning as logic analyzer. The following example is prescribed for explanatory purposes only and is not intended to limit the scope of the invention as defined by the appended claims. The MFI 10 is configured for this example as follows: capacity of 32 channels of timing data represented by two DDA50 plug-ins 22 and 24 (each with 16 channels digital) and each plug-in 22 and 24 with two P8v probes 26 (each probe with 8 channels available). The probes 26 are attached to a set of circuit boards 38. Each acquisition channel 32 (FIG. 2) on the probes 26 is assigned to a point in the unit under test 38 (FIG. 3).

Each channel acquires logic level samples (1's and 0's from the point in the UUT 38. Sampling occurs at points in time (sample points) determined by the operator's selected data clock 46. An analog channel uses eight digital channels in the preferred embodiment to represent the analog wave form.

Sampling begins when the MFI 10 is ARMED. The MFI 10 is ARMED when one of the following occurs:

The Arm Key Trig Key on the keypad 16, or the MFI 10 receives an Arm Key or Trig Key command over the communications port 14 from the MCP software 11, while the MFI 10 is IDLE (not ARMED).

The MFI 10 is triggered while in AUTO-ARM mode.

Sampling stops when one of the following occurs:

The MFI 10 is disarmed by pressing the Arm Key on the keypad 16 or sending the Arm Key command to the communications port 14 to the MCP software 11, while the MFI 10 is ARMED.

MFI 10 is triggered.

The MFI 10 is triggered by one of the following:

The occurrence of a specified sequence of trigger patterns followed by a trigger delay number of data clocks 46.

The Trig Key on the keypad 16 is pressed or the Trig Key command is sent to the communications port 14 to the MCP software 11.

When the MFI 10 is triggered it will display the acquired data on the video monitor 18 or on the PC 12.

Each channel maintains a data record of the most recent samples. The number of samples in a channel's record is determined by the plug-in 22 and 24 type and data clock 46 for that channel. The record size can also be affected by concurrent pattern generation within the MFI. Generally, the record size is from 512 to 8192 samples.

A trigger pattern is an operator defined combinational state of input channels. For a particular trigger pattern, the user can assign a state for each acquisition channel, a 1 or a 0 or an x (for "DON'T CARE"). When this combination of states occurs simultaneously on the acquisition channels, the defined trigger pattern is said to have occurred.

| | TRIGGER PATTERN |
| --- | --- |
| PROBE # | 2222111111100000000 |
| Pin # | 32107654321076543210 |
| TP01 | XXXXXXXXXXXXXXXXXXXX |

When the MFI 10 is triggered, the channel records are available in their final form to be viewed on the MFI's display screens. These records may be viewed as timing diagrams (FIG. 4) or as one of many data domain displays, including microprocessor disassembly, that the MFI 10 can generate.

The above discussion on the invention data acquisitions/sending operations is the same in either the stand alone mode (MFI 10 controls the activity) or the coupled mode (MCP 11 controls the activity).

Referring now again to FIG. 3, the MFI control program (MCP) 11 provides the capability to use PC based technology to control and enhance the performance of the MFI 10.

The MFI 10 is connected to the MCP 11 by standard interfaces 14 (e.g., RS-232 communications port or GPIB IEEE-488 interface). The MCP 11 operates as a menu driven, interactive program organized into six major functions: control 52, editing 54, filing and transfer 56, viewing 58, testing 60, and other 62.

The control menu 52 provides the capability to control the MFI 10 directly, including the MFI menus 49. There are two modes associated with this menu:

a) blind control provides keys on the PC keyboard as replacements for the keys on the MFI keypad 16. Control is exercised by using the keyboard keys to interact with the menus and displays produced by the MFI 10; and b) remote control provides the capability to replace both the MFI keypad 16 and monitor 18 with the PC 12. The PC 12 displays the current MFI display on one half of the monitor 18 and displays valid MCP control keys on the other half.

Editing menus 54 provide the capability to change or modify data contained in the MCP memory 50. Data can be edited using either the digital/analog waveform display (such as illustrated in FIG. 4) or the hexadecimal character display. Additional functions are provided to edit the waveform display; mark, unmark, copy, fill, and duplicate digital waveform segments; generate digital counting patterns; generate simple analog waveforms; and perform mathematical operations on analog waveforms.

Filing and transfer menus 56 provide the capability to control the transfer of information between the MFI 10 and the MCP 11. It allows the MCP 10 and MCP 11 to share setups and data. Setups are the copy of all working menu variables and reflect menu settings (MFI menus 49a–49k and MCP menus 52–62). Filing functions provide disk accessing and storage on the PC disk system.

Viewing menus 58 provide the capability to select the data being displayed, to label and arrange the order of the channels in the display, to control the resolution of the display, to display specific portions of the data, and to select between a waveform representation and a hexadecimal character representation.

Testing menus 60 provide the capability to test chips, circuits, PC boards, and other electrical or electronic devices or assemblies. The MFI 10 is automatically reconfigured for a specific test through the filing functions.

Other menus 62 provide the following miscellaneous functions: setting communications baud rate, copying among buffers, listing files in the working directory, changing directories, outputting a control byte to the parallel port, uploading and downloading EPROM images.

In addition to the aforementioned menus 52–62, the MCP 11 provides the capability to record operator commands as they are entered from the PC 12 (FIG. 1) keyboard or keypad 16 and to execute these sequences on command, generating the same activity as when they were first recorded. The macro functions 64 allow the MCP 11 to run tests without operator interaction.

Figure 5:
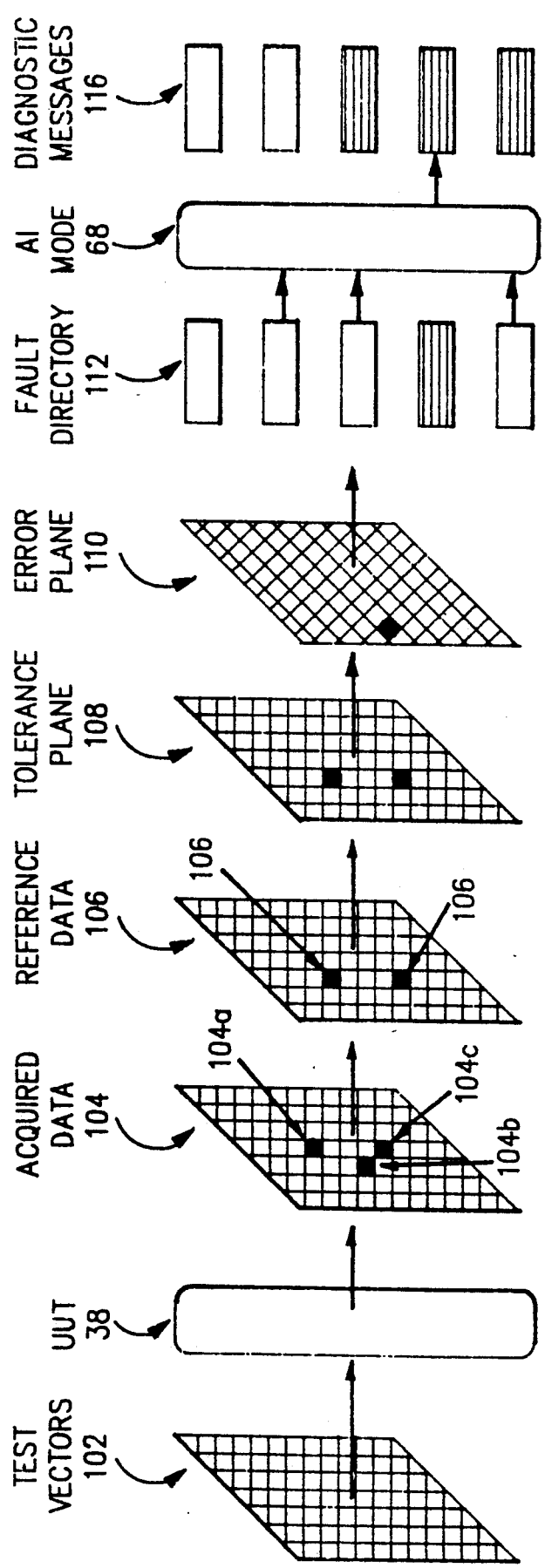
FIG. 5 is a schematic representation of data arrays used in accordance with the present invention.

Referring now also to FIG. 5, there is shown a schematic representation of data arrays as used in accordance with the present invention. In operation, test vectors 102 are applied to a unit under test (UUT) 38. While UUT 38 is usually a printed circuit board, it may also be a single device. The invention contemplates several ways of creating test vectors 102. If UUT 38 contains a microprocessor or other intelligence, and actually performs a function when the power is turned on, MCP 11 (FIG. 3) can learn the function of UUT 38 by connecting to it and observing the normal response.

Alternatively, an operator can visually create test vectors using a highly interactive graphical user interface and editor.

Another method to create test vectors is to download simulation data from a computer aided design (CAD) system database, not shown, to PC 12. When a device or a board is designed, a simulation using a CAD system is often created to validate the design. While such a simulation may not be perfect information for the test process, it is usually a good starting point.

Test vectors 102 are applied to UUT 38 to acquire data for the board under test 38. An acquired data plane or array 104 is generated as a result of applying test vectors 102 to UUT 38. Circles 104a–104c in FIG. 5 indicate information gathered. The two-dimensional representation of this plane of information 104 illustrates one of the unique features of the invention. Wherever a test point is interrogated, information is gathered continuously in the form of a data array. For purposes of this description, it is useful to know that reference data are the responses and information gathered from a known good board.

Data represented by three circles 104a–104c on the acquired data plane 104 are compared to reference data 106a, 106b on reference data plane 106. A single test is sufficient to obtain a reference.

A number of good boards 38 can be used to create a tolerance data plane 108. Since a known good board can have variations that are considered normal, the tolerance plane 108 is a representation of the normal variations of a known good board. For example, a pulse might be one millisecond wide on the board that is being measured. But it is quite likely that a range of, say, from 0.9 to 1.1 milliseconds is valid normal acceptable data.

One could measure a plurality of good boards (e.g., 50 boards) and vary their power supply and temperature to learn normal variance from the good boards. Alternatively, one can use an interactive graphical user interface, hereinbelow described in greater detail, and "tolerate out" (i.e., specify) that range of values, 0.9-1.1 milliseconds. Thus, test vectors 112 are applied to UUT 38 to acquire data 104. Reference data 106 from one good board is already in memory.

A simple logical compare (EXCLUSIVE NOR) is performed on a bit-by-bit basis hundreds of thousands of times between the acquired data 104 and the reference data 106. Any deviations between data in the two planes 104, 106 are then compared to data in the tolerance data plane 108. Here a logical AND operation is used as a mask. Any deviations that have been seen in the first array operations are now compared to this mask 108 again. In this way, massively parallel logical operations occur hundreds of thousands of times.

By the time the error plane 110 is reached, all deviations which have been observed or predicted by simulations are identified. The mode of analyzing data is far different than traditional methods. As a result, faults are defined that would simply be missed by other kinds of test systems.

To build tolerance, an operator decides that the deviations are acceptable; acquired data 104 is compared to reference data 106 and any variances within the tolerance plane 108 are accepted. Once tolerance has been built up, the system is ready to check for errors.

Acquired data 104 not favorably compared to reference data 106 nor within tolerance plane 108 results in errors, stored in an error plane 110. An error is defined as an acquired response that is not tolerated out. A pass/fail, go/no-go test can be performed at this point. If there are no errors, the board under test 38 passes.

If, however, errors exist, the system can memorize data patterns of faults as well as data patterns of known good boards. If there is a variance, the system can identify that condition and associate that pattern with an English language message 116 previously provided by an operator. For example, "U2, pin 3 Shorted to Ground" would be the sort of message that an operator might see, which is associated with a purely internal mathematical representation. One advantage of this diagnosis is that the system can provide an associated fault with an English language message, which an unskilled operator can then use to debug a UUT 38.

The system can store many of these fault patterns, each under a different message. In the process of learning what a good board is or in the process of creating reference data 106, an operator can train the system with a certain number of known faults. In this case, the operator essentially provides the system with a knowledge of faults. For example, U2, pin 2 can be shorted to U2, pin 3. When the test is run, it will fail and the operator enters the appropriate error message. This fault is added to a directory 116 with that English language message. This process can be repeated for different intentionally provoked faults.

Subsequently, a test is performed on another UUT 38, resulting in an error. The board fails and the system checks its memory to see if the fault patterns match any that has been seen before. If such a match occurs, the appropriate English language message is displayed. In such a case, the system indicates close to 100% certainty that an error is caused by a fault previously stored.

Figure 6:
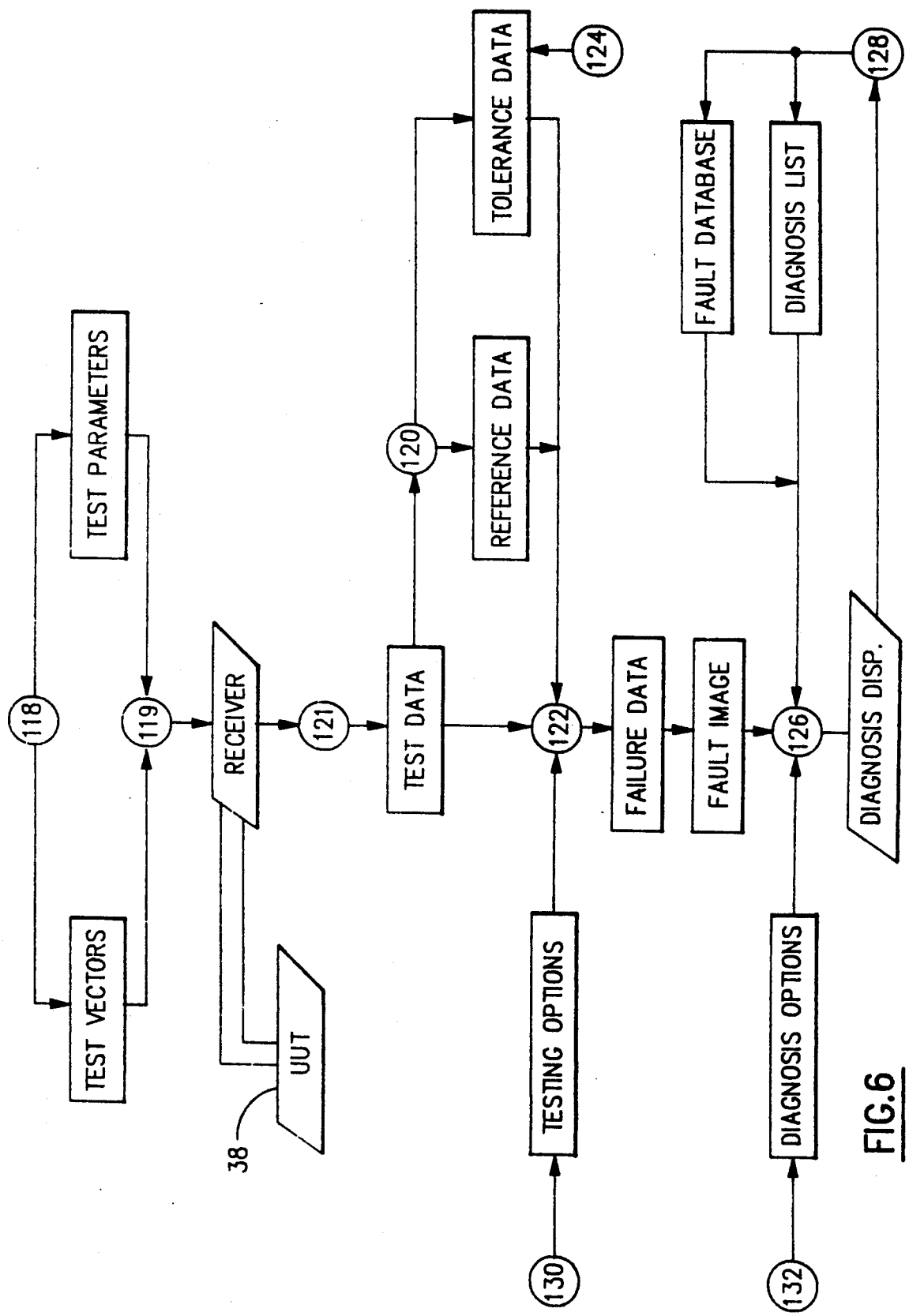
FIG. 6 is a flow chart of the testing process in accordance with the present invention.

Referring now also to FIG. 6, there is shown a flow chart of the testing process Test vectors and test parameters are entered into the MCP 11, step 118. These vectors and parameters are downloaded, step 119, into the inferential software 68 (FIG. 5). As explained above, the system enters an ARMED state, step 121, where data is acquired from the UUT 38 until the Trigger is encountered when data is sent to the MCP 11 via the interface 14.

Reference and tolerance data are developed, step 120. Initially, these data are developed by setting the reference data set to test data and setting the tolerance data to zero or by using the waveform editor 54 (FIG. 1). Test data acquired from the UUT 38 is compared to the reference and tolerance data, step 124.

Results, step 122, that differ from the reference and tolerance data are entered into the fault database. From known good boards, the tolerance data is increased by the difference, step 120.

Failure data is passed to fault image and displayed, step 126. Fault isolation improves with increased fault database size.

The operator directs any newly discovered fault to the fault database, step 128. At this point in the process the operator can edit any previous diagnosis. The operator can set the testing options, step 130, and the diagnosis options, step 132.

Referring now again to FIG. 5, the inferential software 68 provides the capability to "learn" to recognize fault conditions in analog and/or digital signals. A fault directory is either created by simulating failures or by learning faults as they occur during normal testing.

Once fault data is stored in memory, a newly-detected fault can be compared with the stored faults. A relationship between the stored fault data and the detected fault is determined. The system indicates the cause of the detected fault to the operator based on stored fault data that is most probably related to the detected fault. This system analysis and range of potential causes can be evaluated by an operator.

Figure 7:
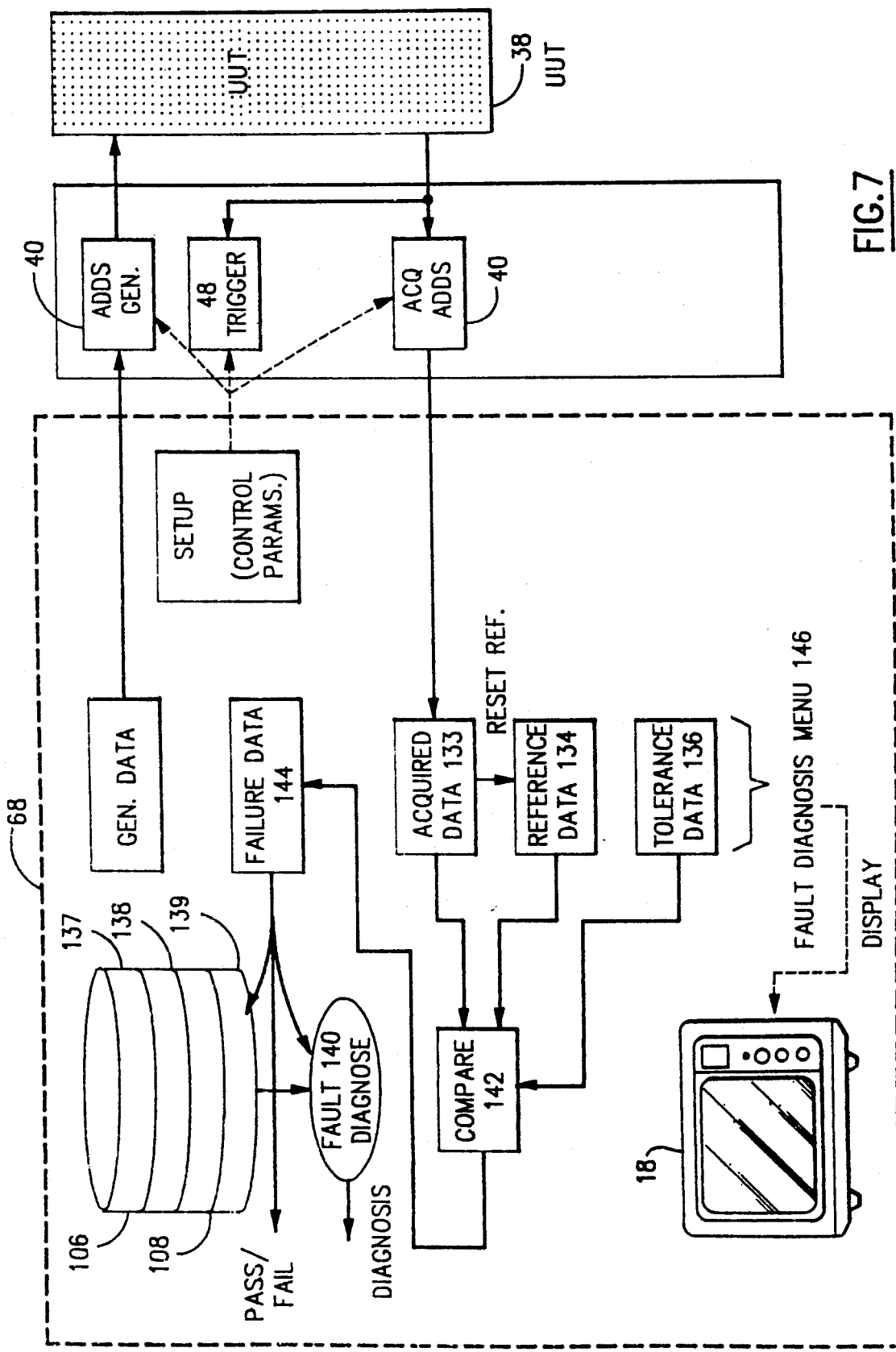
FIG. 7 is a schematic representation of the testing process in accordance with the present invention.

Referring now to FIG. 7, there is shown a schematic representation of the inferential software principles behind the testing strategies. These strategies are summarized below:

Repeatable Results

The principle utilized in testing assumes that the operation of a circuit may be judged by examining its operating signals.

The first step in developing any test is to devise test vectors and acquisition points that, when applied to the unit under test 38, will produce the same results repeatedly. A device that is working properly will produce a predictable and identifiable result. It is assumed that any deviation from predicted operation is produced by an error in the UUT 38. That UUT 38 has failed the test.

Reference and Tolerance Comparison

Even devices which are working properly may show some normal drifting and timing jitter between successive iterations of the same test. The test mechanism was designed to cope with this problem.

In order for the MCP 11 to be able to determine when a device passes and when it fails, the software must have a standard to judge the incoming results (the Acquired data 133). This standard is referred to as the reference image 134. In most cases, the reference image 134 is simply a copy of the first set of results returned by a good device.

The test is performed again and the new results are compared against the old results and stored in the reference image 134. Any differences that occur between successive tests of the same device are recorded in the tolerance image 136.

Once all the deviations of the good device are characterized, the good device will always pass because any deviations from the norm have been recorded in the tolerance image 136 and are ignored. This procedure is then repeated with other known good UUTs 38 until the tolerance image 136 has become broad enough to include all th discrepancies which normally occur among properly working UUTs 38.

Error Pattern Processing

The inferential software, shown in FIG. 7 with dashed lines and identified by reference numeral 68, assumes that, depending upon the specific test configuration, unique faults in the unit under test 38 will produce unique patterns of discrepancies.

One fault, a bad chip for example, might cause massive failures all across four channels; whereas another fault, say one signal stuck low, might cause failures during only part of the test on only one channel.

In each case, the position, timing and location of the resulting test deviations show that each fault produces a very different pattern of failures in the test data 144.

The function of the inferential software 68 can be expressed as follows:

1) Reduce the actual test failure data to a failure synopsis, or fault pattern, which is saved in a database file assigned automatically on a test by test basis.
2) Associate a specific fault diagnosis or comment with each fault pattern stored in the database 138.
3) Compare the incoming fault pattern with all patterns in the database and display the diagnosis descriptions of patterns that match closely 142.
4) Provide a menu-driven interactive interface for developing, utilizing, and maintaining the fault diagnostic databases.

Inferential software 68 keeps a record, or mathematical representation, of the specific error patterns that occur in the process of testing. When a fault pattern is added to the database 138, it is associated with an operator-defined 64-character string referred to as the fault diagnosis 140.

Initially, the fault patterns can be associated with a descriptive comment. As the causes for these errors are determined, the initial comment can be replaced with the diagnosis. The next time an error occurs, the inferential software 68 will report any fault patterns in the database 138 that are similar to the new fault pattern.

Once an error has been identified by the user, the inferential software 68 will be able to recognize and diagnose that error with a high degree of accuracy because it will recognize that fault's unique pattern.

Furthermore, even when processing a pattern for the first time, the inferential software 68 will correlate to the most likely fault already stored and will display at least the best match it can find.

The inferential software 68 is an extension of the testing mechanism already inherent in the MCP 11 (FIG. 3), so all user access to the inferential software 68 is achieved through the testing functions menus 60 (FIG. 3) of the MCP 11.

The inferential software database 138 is maintained in two files (in addition to those generated by the MCP 11 itself). The names of these fields are derived from the MCP 11 data file name and the currently loaded storage frame number.

For example, if the full filename of the data file currently open is "TSTNAME.DAT", the following files would be created during test development and diagnosis:

TSTNAME.22 Reference file 106 and tolerance file 108 for frame 22.

TSTNAME.F22 Inferential software database 138 file of fault descriptions for frame 22.

TSTNAME.X22 Inferential software database 138 file of fault patterns for frame 22.

The fault description file 137 name is formed, as shown above, by taking the reference file 106 name and inserting the letter 'F' between the period '.' and the frame number. This file consists of linefeed terminated strings, each within a fixed 80-character cell. It is possible to use the DOS "TYPE" command or any standard ASCII text editor to display this file. The index number refers to the fault's actual position in the file.

The fault pattern file 139 name is formed in the same way as the fault description file 106 except that the letter 'X' is inserted instead of the letter 'F'. This file consists of fixed size blocks; each block contains one fault pattern. The index number of a fault pattern is identical to the index number of its corresponding position.

The fault diagnosis menu 146 is the focal point for all inferential software 68 activity. On entry to this menu 146, the current failures are abstracted from the exception buffer, not shown, and a new fault pattern is formed, which is matched automatically against all patterns in the database 138. Diagnoses are displayed by group according to the percentage of correlation (figure of merit) between the new fault pattern 139 and each fault in the database 138. Each fault description 116 (FIG. 5) is labeled with its unique fault index. A list of fault diagnosis menu functions appears in Table I, below.

TABLE I
FAULT DIAGNOSIS MENU FUNCTIONS

| | |
|---|---|
| Best | Conduct the matching process again in order to display the group of faults which match best. |
| Change | Select a specific fault by its index and change the fault description or comment. |
| Delete | Select a specific fault and delete it from participation in the matching process. |
| Examine | Select a fault and examine the associated error pattern synopsis. |
| Find | Find all fault descriptions which match the target string entered by the user. |
| Include | Include the new fault pattern under an existing description. |
| List | Generate the same display as the Examine function, also sending it to the standard print device. |
| New | Add the new error pattern to the database with an associated diagnosis or comment. |
| Options | Select Fault Diagnosis Options such as fault type and weight. |
| Query | Query the database for matches against a specific fault pattern already in the database. |
| Replace | Replace the fault pattern for an existing description with the current fault pattern. |
| Show Next | Display the next best group of matching diagnoses. |
| Test | Return to the Testing Menu (FIG. 3) 60 and execute the Test function. |
| ESC | Return to the Testing Menu (FIG. 3) 60. |

The figure of merit (FOM) is displayed for each group of faults displayed. This value is a percentage from 0 to 100 which indicates how closely the listed fault patterns match the new fault pattern. A figure of merit of 100% indicates that the listed fault pattern matches the new pattern exactly, whereas 0% indicates that the patterns do not match at all.

In order to understand how the figure of merit is calculated, it is helpful to imagine an error plane consisting of "channels" on one axis and "time samples" on the other. All entries are normally binary zero. Each time a discrepant value (i.e., an error) is found, a binary one is placed in the array. The number of channels is arbitrarily 96 and the number of time samples is 2 K (i.e., 2048).

The contents of each channel is a number (e.g., 2 K in the preferred embodiment) of binary data samples representing error information from the UUT collected during a test frame.

It is desirable to represent the contents of each channel in several forms, each providing a different way of looking at the data. Three ways of describing this information are by means of BIT, GROUP and RANGE.

BIT is a binary word representing the number of errors in the 2 K record.

GROUP is a binary word representing the number of times the error data goes from "no error" to "error".

RANGE includes bits that, when set, represent the case when a segment contains an error. The 2 K record is divided into sixty four, 32-bit segments.

In the following example, data are placed in groups of eight for simplicity of discussion herein.

| | 00111010 | 11110000 | 01010100 | 00000000 | Derived No. |
|---|---|---|---|---|---|
| BIT | 4 + | 4 + | 3 + | 0 = | 11 |
| GROUP | 2 + | 1 + | 3 + | 0 = | 6 |
| RANGE | | | 1 | = | 1 |

Each of the aforementioned three derived numbers is stored on a per channel basis.

The FOM calculation uses the three derived numbers as a basis of its calculations. It is desirable to generate a 1 (100%) if all errors match and a 0 (0%) if no match exists.

In normal operation, these numbers are stored for each specific error pattern. Each pattern has an English language message associated therewith. The test is run on a new UUT and the three derived parameters are generated. These parameters are compared with stored fault information in the following way, in which the following terms are defined as shown below.

Base Bits = No. of error bits in stored error plane.
New Bits = No. of error bits in acquired error plane.
Match Bits = No. of error bits in common between Base Bits and New Bits.

Using the above-mentioned BIT, GROUP and RANGE numbers independently, the following ratios are calculated.

$$FOM_{BIT} = \frac{\text{Match Bits}}{\text{Base Bits}} \times \frac{\text{Match Bits}}{\text{New Bits}}$$

$$FOM_{GROUP} = \frac{\text{Match Groups}}{\text{Base Groups}} \times \frac{\text{Match Groups}}{\text{New Groups}}$$

$$FOM_{RANGE} = \frac{\text{Match Range Bits}}{\text{Base Range Bits}} \times \frac{\text{Match Range Bits}}{\text{New Range Bits}}$$

$$FOM_{TOTAL} = \tfrac{1}{3} FOM_{BIT} + \tfrac{1}{3} FOM_{GROUP} + \tfrac{1}{3} FOM_{RANGE}$$

As can be seen by the foregoing equation, the figure of merit as reported on the monitor represents the weighted average of the different methods. Moreover, other sources of information can be used in this manner, without departing from the scope of the present invention, to contribute to the weighted average. In particular, serial bit streams (as in J-Tag and other boundary scan information) complete data without BIT, RANGE or GROUP calculation. Encoding schemes, including transition encoding, to preserve all information in a compressed form are all valid ways to create a FOM using this technique. Many other ways are possible to accent a way that a UUT might fail in practical situations.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention .

What is claimed is:

1. In an adaptive inference system having an operative program for predicting causes of a previously unobserved fault appearing in an electric or electronic device or assembly from relationships with other known and previously stored fault data and information gathered for said electric or electronic device or assembly in prior tests, said adaptive inference system characterized by a method of displaying performance failures in a graphical test sequence presented upon a time dependent display, said method comprising the steps of:
   a) displaying test data and information along a time dependent axis of a display screen, said test data containing performance data along all operative channels of said device or assembly, failures in performance along any of said channels being highlighted for ease of viewing, and said test information containing test evaluation information of said performance data including tolerance information, said test evaluation information being stored for comparison with data and information of prior tests to provide a figure of merit of a probable cause of failure; and
   b) positioning at least one graphics sub-display on said display screen during said test.

2. The method displaying testing operations of claim 1, wherein said displaying test data step (a) includes displaying test data in analog form.

3. The method of displaying testing operations of claim 1, wherein said displaying test data step (a) includes displaying test data in digital form.

4. The method of displaying testing operations of claim 1, wherein said displaying test data step (a) includes displaying test data in both analog and digital form.

5. The method of displaying testing operations of claim 4, further comprising the step of:
   c) editing both analog and digital test data.

6. The method of displaying testing operations of claim 1, further comprising the step of:
   c) editing said test data being displayed, including adding test evaluations to said test data.

7. The method of displaying testing operations of claim 1 wherein said graphics sub-display comprises a pop-up window displayed adjacent to said test data.

8. The method of displaying testing operations of claim 1 wherein said graphics sub-display comprises a pull-down menu displayed adjacent to said test data.

9. The method of displaying testing operations of claim 1, further comprising the step of:
   c) highlighting predetermined portions of data of said device or assembly, including highlighting data indicative of failures in performance of said device or assembly.

10. The method of displaying testing operations of claim 9, wherein said highlighting of said display is performed in a color.

11. The method of displaying testing operations of claim 10, wherein said color is red.

12. An adaptive inference system having an operative program for predicting causes of a previously unobserved fault appearing in an electric or electronic device or assembly from relationships with other known and previously stored fault data and information gathered for said electric or electronic device or assembly in prior tests, said adaptive inference system, including apparatus for testing and displaying performance of said electrical or electronic devices or assemblies in a test sequence presented in graphical form upon a time dependent display, comprising:
   a) means for displaying test data and information respective of performance of said electrical or electronic device or assembly along a time dependent axis of a display screen, said test data containing performance data along all operative channels of said device or assembly, including means for highlighting failures in performance along any of said channels for ease of viewing, and said test information containing test evaluation information of said performance data including tolerance information, said test evaluation information being stored for comparison with data and information of prior tests to provide a figure of merit of a probable cause of failure; and
   b) means for positioning at least one graphics sub-display on said display screen during display of said test.

13. The apparatus of claim 12, wherein said means for displaying test data includes means for displaying test data in analog form.

14. The apparatus of claim 12, wherein said means for displaying test data includes means for displaying test data in digital form.

15. The apparatus of claim 12, wherein said means for displaying test data includes means for displaying test data in both analog and digital form.

16. The apparatus of claim 15, further comprising:
   c) means for editing both analog and digital test data.

17. The apparatus of claim 12, further comprising:
   c) means for editing said test data being displayed.

18. The apparatus of claim 12, wherein said graphics sub-display further comprises means for displaying a pop-up window adjacent to said test results.

19. The apparatus of claim 12, wherein said graphics sub-display further comprises means for displaying a pull-down menu adjacent to said test results.

20. The apparatus of claim 12, further comprising:
   c) means for highlighting predetermined portions of said display in addition to failure data.

21. The apparatus of claim 20, wherein said highlighting of said display is performed in a color.

22. The apparatus method of claim 21, wherein said color is red.

* * * * *